United States Patent
Agarwal et al.

(10) Patent No.: US 11,387,402 B2
(45) Date of Patent: Jul. 12, 2022

(54) PIEZOELECTRIC SENSOR ASSEMBLY

(71) Applicants: Anuj Agarwal, Lexington, KY (US); Michael Lhamon, Lexington, KY (US)

(72) Inventors: Anuj Agarwal, Lexington, KY (US); Michael Lhamon, Lexington, KY (US)

(73) Assignee: Signal Solutions, LLC, Lexington, KY (US)

( * ) Notice: Subject to any disclaimer, the term of this patent is extended or adjusted under 35 U.S.C. 154(b) by 412 days.

(21) Appl. No.: 16/554,607

(22) Filed: Aug. 28, 2019

(65) Prior Publication Data
US 2021/0066576 A1 Mar. 4, 2021

(51) Int. Cl.
*H01L 41/113* (2006.01)
*H01L 41/187* (2006.01)

(52) U.S. Cl.
CPC ........ *H01L 41/1132* (2013.01); *H01L 41/187* (2013.01)

(58) Field of Classification Search
CPC .......................... H01L 41/1132; H01L 41/187
See application file for complete search history.

(56) References Cited

U.S. PATENT DOCUMENTS

| | | | | |
|---|---|---|---|---|
| 4,859,896 A | * | 8/1989 | Anders | H02N 2/028 310/328 |
| 5,423,207 A | * | 6/1995 | Flechsig | H01L 41/1132 310/318 |
| 5,831,370 A | * | 11/1998 | Sugaya | H02N 2/001 310/323.01 |
| 7,800,595 B2 | * | 9/2010 | Hill | H01L 41/1132 345/177 |
| 2003/0057804 A1 | * | 3/2003 | Uchiyama | H01L 41/0986 310/311 |
| 2008/0312524 A1 | * | 12/2008 | Solosko | A61B 5/1126 600/393 |
| 2017/0208890 A1 | * | 7/2017 | Torvinen | A43B 5/00 |

FOREIGN PATENT DOCUMENTS

JP 2013123150 A * 6/2013

* cited by examiner

*Primary Examiner* — J. San Martin
(74) *Attorney, Agent, or Firm* — Stockwell & Smedley PSC

(57) ABSTRACT

A piezoelectric sensor comprising an insulator layer having opposing upper and lower surfaces, a first piezoelectric portion having a lower surface in contact with the upper surface of the insulator layer, a second piezoelectric portion having a lower surface in contact with the upper surface of the insulator layer and an insulator strip dividing the first and second piezoelectric portions, wherein the first portion and second piezoelectric portion are laterally positioned with respect to one another in the same generally planar layer.

9 Claims, 4 Drawing Sheets

PIEZOELECTRIC SENSOR ASSEMBLY

BACKGROUND OF THE INVENTION

The invention relates generally to the field of piezoelectric sensors and their use, and more particularly the invention is directed to a piezoelectric sensor including a composite sensor plate for sensing the activity of live subjects such as animals.

Bioelectric signals such as Electromyogram (EMG), Electroencephalogram (EEG), and Electrocardiogram (ECG) increase our understanding of the physiological mechanisms in the human body and can be measured externally by placing electrodes on the skin surface. However, acquiring biosignals in animals is not as straight forward as in humans, especially for rodents which are commonly used as models for human disease in medical research. Accordingly, determining physiological parameters by measuring biosignals is more complicated for non-human subjects, and often requires invasive placement of electrodes via surgery. For example, in rodents (rats, mice), bioelectric signals such as EEG and EMG are obtained from electrodes embedded surgically in their skull. Such surgery and post-surgery care limits application of such techniques for measuring biosignals to small scale studies. While noninvasive methods also exist, these are generally very expensive or have cumbersome equipment setup requirements which are incompatible with the animal's home cage. There are alternative, noninvasive methods for obtaining similar information revealed by measuring biosignals, such as video recording. However, these methods are also cumbersome to setup, have high implementation costs for large numbers of animals and generate a huge amount of data which poses management and efficiency challenges.

A piezoelectric sensor uses the piezoelectric effect to measure the changes in a physical quantity by converting it to an electrical charge. Piezoelectric sensors are available in different geometries such as film, cable, and discs of various geometries. Piezoelectric films and cable sensors are generally made of polyvinylidene fluoride (PVDF) and piezoelectric discs are commonly made of lead zirconate titanate (PZT). Piezoelectric devices have a wide range of application and broadly fit into four categories: generators (such as push button cigarette lighters and tire pressure monitoring sensors); sensors (such as flow sensor, thickness gauges and microphones); actuators (such as stack actuators and stripe actuators); and transducers (such as ultrasonic vibration generators for cleaning, atomizing liquids, drilling and medical diagnostics).

Existing piezoelectric sensors, such as piezoelectric disc sensors, include two wires or electrodes which act as a single-ended connection, where the voltage difference between the piezoelectric portion and the ground is detected and fed to an amplifier for further processing. These single ended connections suffer from electrical noise coupling into the sensor which corrupts the signal of interest.

As will be described herein, the invention relates to, but is not limited to, a piezoelectric sensor, such as a piezoelectric disc sensor, which is constructed and configured to resolve the aforementioned issues and be advantageously used with a variety of chambers, cages and platforms and the use of such a sensor to noninvasively monitor physiological behaviors in live subjects.

SUMMARY OF THE INVENTION

Some embodiments of the invention are directed to a piezoelectric sensor comprising an insulator layer having opposing upper and lower surfaces; a first piezoelectric portion having a lower surface in contact with the upper surface of the insulator layer; a second piezoelectric portion having a lower surface in contact with the upper surface of the insulator layer; and an insulator strip dividing the first and second piezoelectric portions, wherein the first portion and second piezoelectric portion are laterally positioned with respect to one another in the same generally planar layer.

In some embodiments of the sensor of the invention, the first and second piezoelectric portions form a singular layer with two distinct electric signals.

In some embodiments of the sensor of the invention, the first and second piezoelectric portions are different sizes.

In some embodiments of the sensor of the invention, the first and second piezoelectric portions and insulator layer are shaped as discs.

In some embodiments of the sensor further comprises a wire connected to the first portion and a wire connected to the second portion for receiving electric signals from each portion.

In some embodiments of the sensor further comprises a wire connected to the insulator layer for receiving electric signal from the insulator layer.

In some embodiments of the sensor further comprises a signal amplifier connected to the wires.

In some embodiments of the sensor further comprises a covering material extending over the sensor and amplifier.

In some embodiments, the insulator layer and insulator strip are connected to one another.

In some embodiments, the insulator layer and insulator strip are brass.

In some embodiments, the first and second portions are ceramic.

Other embodiments, features and advantages of the invention will be readily appreciated and apparent from the following detailed description when considered in connection with the accompanying drawings.

DETAILED DESCRIPTION OF THE INVENTION

For illustrative purposes, the principles of the invention are described by referencing various exemplary embodiments. Although certain embodiments are specifically described herein, one of ordinary skill in the art will readily recognize that the same principles are equally applicable to, and can be employed in other systems and methods. Before explaining the disclosed embodiments of the present disclosure in detail, it is to be understood that the disclosure is not limited in its application to the details of any particular embodiment shown. Additionally, any terminology used herein is for the purpose of description and not of limitation. Furthermore, although certain methods may be described with reference to steps that are presented herein in a certain order, in many instances, these steps may be performed in any order as may be appreciated by one skilled in the art, and the novel method is therefore not limited to the particular arrangement of steps disclosed herein.

It must be noted that as used herein and in the appended claims, the singular forms "a", "an", and "the" include plural references unless the context clearly dictates otherwise. Furthermore, the terms "a" (or "an"), "one or more" and "at least one" can be used interchangeably herein. The terms "comprising", "including", "having" and "constructed from" can also be used interchangeably.

Figure 1:
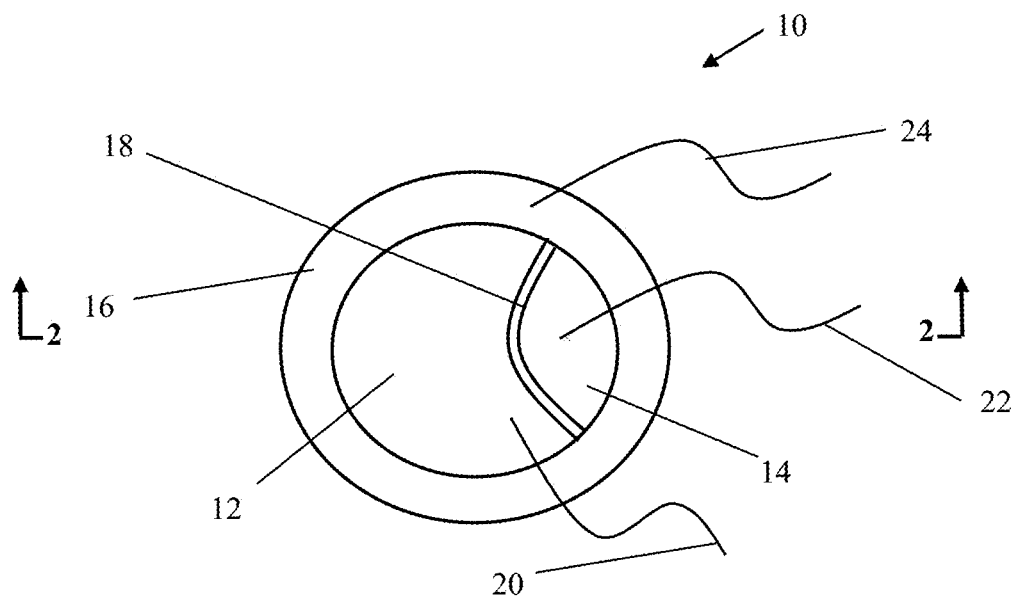
FIG. 1 is a top view of a piezo electric sensor constructed and configured in accordance with an embodiment of the invention.
Figure 2:
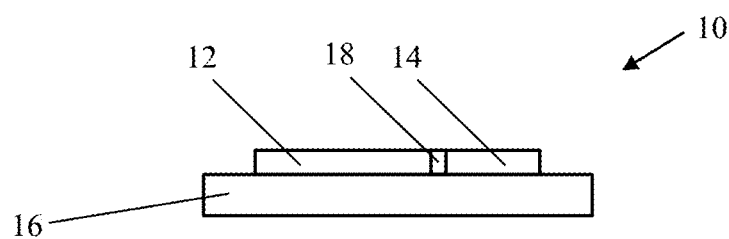
FIG. 2 is a cross sectional view of the piezo electric sensor of FIG. 1 taken along line 2-2.

Referring now to FIGS. 1 and 2, an exemplary embodiment of a piezoelectric sensor of the invention is generally identified by reference number 10. In this embodiment, sensor 10 has an overall circular shape whereas in other embodiments, sensor 10 may be of a different form.

Sensor 10 includes a first piezoelectric portion 12 and a second piezoelectric portion 14. Each portion 12 and 14 has a lower side in contact with an upper side of the non-piezoelectric or insulative layer or ground 16. In this embodiment, portions 12 and 14 form a single planar layer relative to one another, with both being in contact with the same surface of layer 16. Portions 12 and 14 are maintained apart from one another by an insulative or ground dividing strip 18, which may be part of or the same material as layer 16. Strip 18 is within the same plane as portions 12 and 14 and thus divides piezoelectric portions 12 and 14 laterally from one another within the same plane, thus keeping them electrically separated to deliver distinct signals, and maintaining the same overall sensor profile. Wires or electrodes 20 and 22 are in electrical communication with piezoelectric portions 12 and 14, respectively, to receive these distinct electrical signals. Electrode 24 is in electrical communication with layer 16 (and/or in some embodiments, strip 18) to be maintained as a ground.

In operation, the three-wire electrode sensor 10 is configured as a differential connection, wherein the voltage or charge difference between the two distinct signal sources, portions 12 and 14, are input into a difference amplifier (not shown). Coupled electrical noise interferes with both signals which is common to both input signals is cancelled by the amplifier. Sensor 10 is thus less susceptible to noise pick-up as compared with two wire sensors.

Figure 3:
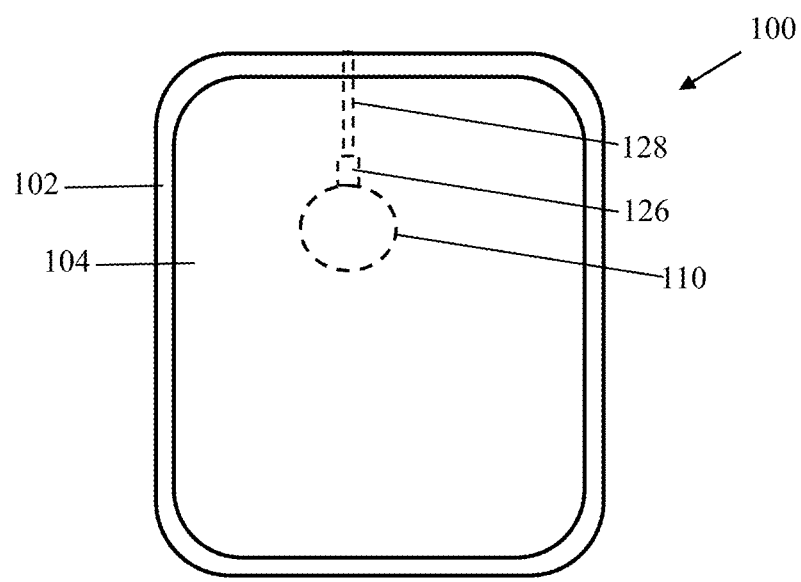
FIG. 3 is a top view of an animal housing in which a sensor of the invention is deployed.

FIG. 3 illustrates a sensor 110 of the invention attached to the bottom 104 of a cage or housing 100 having walls 102. Sensor 110 is connected with an amplifier 126 and wire bundle 128 containing wires connected to the two piezoelectric portions (not shown) and the ground (not shown). It should be understood that the piezo sensor 110 can be located anywhere in the vicinity of the animal cage 100, for example inside the cage, on the side wall, on the lid of the cage, embedded in the wall, etc. Also note that the piezo disc sensor can be attached to the cage in several ways, for example, using liquid adhesive, tape, magnets, screws, etc. The piezo disc sensor 110 could also be present on a separate base (or platform) against which a cage is made to rest.

It should also be understood that the piezo disc sensor 110 may be embedded in a material, such as a plastic or elastomer, such as polyurethane, along with differential amplifier 126. The sensor and amplifier housing may be attached to the bottom of the cage using a magnet. The magnet used to attach the sensor housing can be of varying sizes, shapes, and thickness and can be fixed to the cage in several ways (glued, embedded, paint, etc.) In some embodiments, sensor 110 and amplifier housing 126 can be made from different materials and can be 3D printed, molded, carved, stitched, etc.

While the exemplary embodiments herein describe wired transmission of data from the piezo disc sensor 10 and 110. It should be understood that the transmission of data may be wireless. For large scale applications, the piezo disc sensors of the invention can also be attached to cage racks housing more than 90 cages instead of individual cages, such as cage 100. Depending on the type of rack, the disc sensor of the invention can be either directly or indirectly attached to the cage or can be present on the rack itself. It should be readily apparent that more than one disc sensor of the invention may be present on the cage. For example, multiple sensors on a single cage are useful when there are either a) multiple animals in a single cage or b) there is a need to track the location of a single animal within the cage. In some applications one of the disc sensors of the invention may be specifically used as a reference for noise cancelling applications.

Figure 4A:
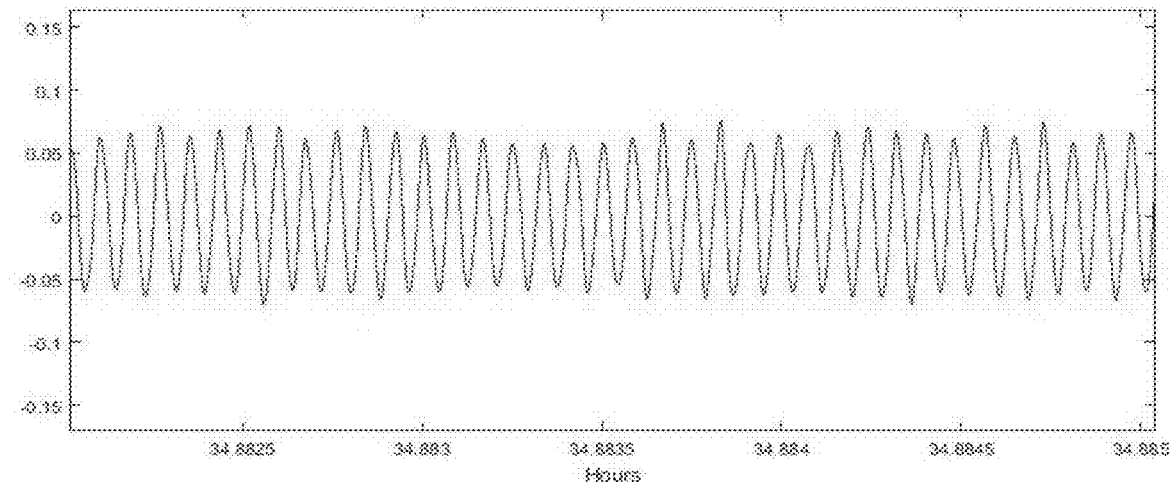
FIGS. 4A and 4B provide Piezo signals as obtained from (A) a piezoelectric film and (B) a piezoelectric disc sensor attached to a mouse cage. The film sensor was located over the cage floor and the disc sensor under the cage floor. The cage floor was made of a 5 mm thick polycarbonate material.
Figure 4B:
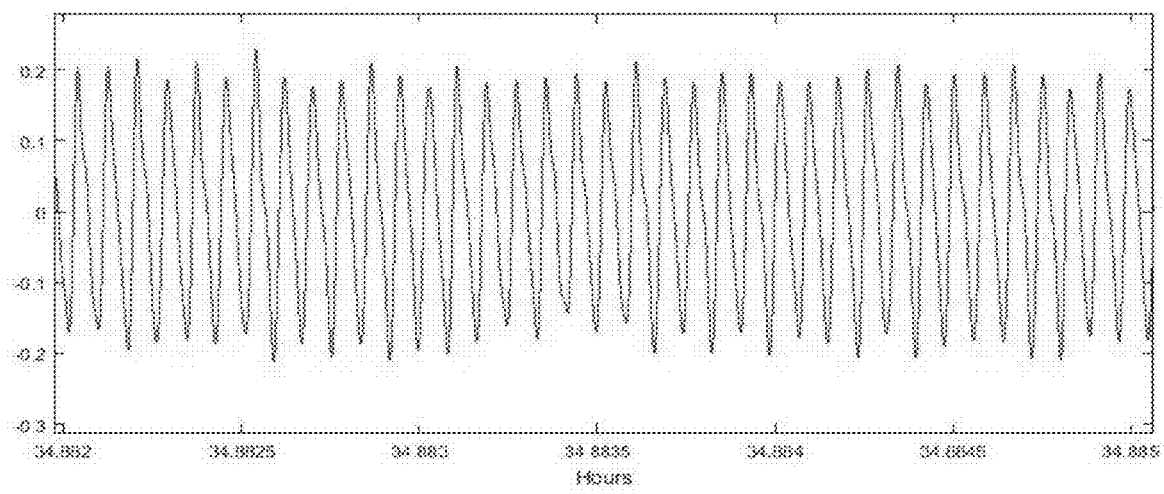

FIGS. 4A and 4B provide comparisons of the signal quality between a piezo film (FIG. 4A) and a piezo disc sensor of the invention (FIG. 4B). Both the film and disc sensors of the invention were attached to a mouse cage. The film sensor was located over the cage floor (made of 5 mm thick polycarbonate sheet) and the disc sensor was located under the cage floor. The data represents a section where the mouse was sleeping inside the cage. When the animal is stationary (like during sleep), the piezo sensors capture the pressure changes due to the periodic movement of the thorax and the displacement of air from the nostrils, occurring due to inhalation and exhalation during breathing. FIGS. 4A and 4B contain about 12 seconds of data, which have about 36 periods of breaths, translating to a respiratory rate of 3 Hz (breaths per second). The data in FIGS. 4A and 4B illustrate that in comparison to a piezo film sensor, the piezo disc sensor of the invention is equally sensitive to mouse behaviors in a cage. The disc sensor is also substantially less expensive to manufacture. The disc sensor of the invention costs $1.60 as compared to a piezo film (about $100) or cable sensor (about $36) and is more widely available commercially.

Figure 5:
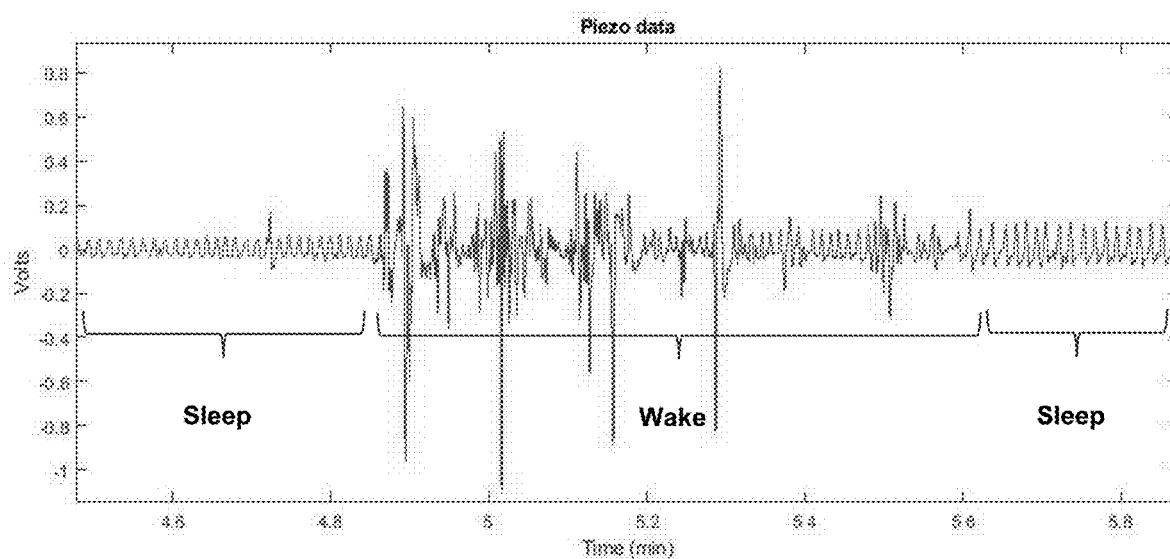
FIG. 5 shows an example of a piezo signal obtained from a rat, where the animal is first sleeping, then wakes up briefly, and goes back to sleep, using a sensor of the invention.

FIG. 5 shows an example of a piezo signal obtained from a rat, where the animal is first sleeping, then wakes up briefly, and goes back to sleep during Sleep, the signal amplitude is low and periodic in nature. When the animal is awake and moving, the signal amplitude is higher but irregular (not periodic).

Figure 6:
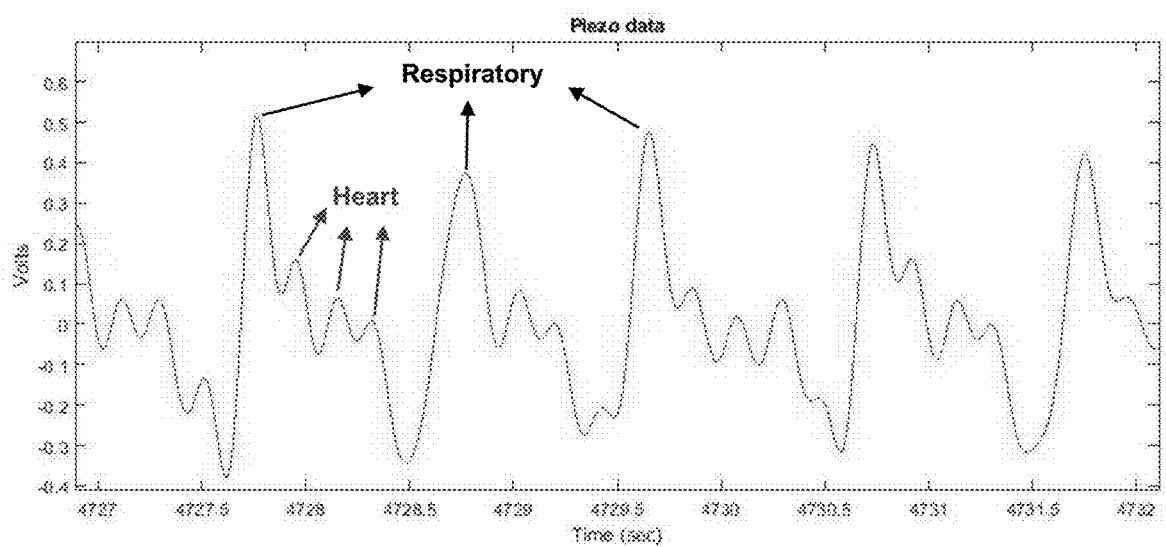
FIG. 6 illustrates piezo signals obtained from a rat using a piezo disc sensor of the invention.

FIG. 6 shows 5 seconds of data obtained from a rat, during sleep. The piezo signal consists of some big peaks corresponding to respiration, and some small peaks corresponding to the beating of the heart. For both the large peaks and the small peaks, the inverse of the inter peak distance gives estimates of the respiratory rate and the heart rate. As shown in the figure, there are 5 big peaks and 20 big+small peaks occurring over 5 seconds, which yields a breath rate of 1 Hz (breaths per second) and a heart rate of 4 Hz (beats per second) for this rat.

Thus, as described herein a piezo disc sensor of the invention enables noninvasive detection of sleep, Activity, breathing rates, and heart rates. The sensor of the invention can also be used for detection of epilepsy and sleep apneas. For example, epilepsy is marked by distinct changes in animal posture and movement, which can be captured by the piezo disc sensor of the invention. Sleep apnea is exhibited by a long pause in breathing during sleep, which can also be captured using the piezo disc sensor of the invention. It should be understood that the use of the piezo disc sensor of the invention is not limited to sleep, activity, breath rates, and heart rates, in that there may be many other potential applications of the sensor of the invention.

This written description uses examples to disclose the invention and also to enable any person skilled in the art to practice the invention, including making and using any devices or systems and performing any incorporated methods. The patentable scope of the invention is defined by the claims, and may include other examples that occur to those skilled in the art. Other aspects and features of the invention can be obtained from a study of the drawings, the disclosure, and the appended claims. The invention may be practiced otherwise than as specifically described within the scope of the appended claims.

Although specific features of various embodiments of the invention may be shown in some drawings and not in others, this is for convenience only. In accordance with the principles of the invention, any feature of a drawing may be referenced and/or claimed in combination with any feature of any other drawing.

While exemplary devices, apparatus, systems and methods of the invention have been described herein, it should also be understood that the foregoing is only illustrative of a few particular embodiments with exemplary and/or preferred features, as well as principles of the invention, and that various modifications can be made by those skilled in the art without departing from the scope and spirit of the invention. Therefore, the described embodiments should not be considered as limiting of the scope of the invention in any way. Accordingly, the invention embraces alternatives, modifications and variations which fall within the spirit and scope of the invention as set forth by the claims and any equivalents thereto.

The invention claimed is:

1. A piezoelectric sensor comprising:
    an insulator layer having opposing upper and lower surfaces;
    a first piezoelectric portion having an upper surface and a lower surface in contact with the upper surface of the insulator layer;
    a second piezoelectric portion having an upper surface and a lower surface in contact with the upper surface of the insulator layer; and
    an insulator strip dividing the first and second piezoelectric portions, the insulator strip being a raised portion connected with the insulator layer, the raised portion having an upper surface,
    wherein the first piezoelectric portion, the second piezoelectric portion and the raised portion dividing the first and second piezoelectric portions are laterally positioned with respect to one another, and wherein the upper surface of the first piezoelectric portion, the upper surface of the second piezoelectric portion and the upper surface of the raised portion form the same generally planar upper surface layer of the piezoelectric sensor to maintain a unitary planar sensor profile.

2. The piezoelectric sensor of claim 1, wherein the first and second piezoelectric portions form a singular layer with two distinct electric signals.

3. The piezoelectric sensor of claim 1, wherein the first and second piezoelectric portions are different sizes.

4. The piezoelectric sensor of claim 1, wherein the insulator layer is shaped as a disc.

5. The piezoelectric sensor of claim 1, further comprising a first one or more electrical conductors in electrical communication with the first piezoelectric portion and a second one or more electrical conductors in electrical communication with the second piezoelectric portion for receiving electric signals from each portion.

6. The piezoelectric sensor of claim 5, further comprising a third one or more electrical conductors in electrical communication with the insulator layer for grounding the insulator layer and the raised portion.

7. The piezoelectric sensor of claim 6, further comprising a signal amplifier connected to the wires.

8. The piezoelectric sensor of claim 7, further comprising a covering material extending over the sensor and amplifier.

9. The piezoelectric sensor of claim 1, wherein the first and second portions are ceramic.

* * * * *